United States Patent [19]
Webb

[11] Patent Number: 4,879,761
[45] Date of Patent: Nov. 7, 1989

[54] BISTABLE OPTICALLY CLOCKED OPTICAL SIGNAL REGENERATOR

[75] Inventor: Roderick P. Webb, Woodbridge, England

[73] Assignee: British Telecommunications, plc, London, England

[21] Appl. No.: 143,857

[22] PCT Filed: May 26, 1987

[86] PCT No.: PCT/GB87/00360

§ 371 Date: Jan. 19, 1988

§ 102(e) Date: Jan. 19, 1988

[87] PCT Pub. No.: WO87/07458

PCT Pub. Date: Dec. 3, 1987

[30] Foreign Application Priority Data

May 28, 1986 [GB] United Kingdom ............... 8612956

[51] Int. Cl.$^4$ ............................................. H04B 9/00
[52] U.S. Cl. ............................. 455/601; 330/308; 372/70; 455/608; 455/618
[58] Field of Search ............... 250/214 A; 350/96.13; 330/4, 3, 308, 59; 372/26, 38, 69, 70, 25, 30, 96; 455/600, 606, 607, 608, 609, 610, 611, 612, 617, 618

[56] References Cited

U.S. PATENT DOCUMENTS

| | | | |
|---|---|---|---|
| 3,887,876 | 6/1975 | Zeidler | 455/612 |
| 4,004,248 | 1/1977 | Muller | 372/99 |
| 4,475,201 | 10/1984 | Chiu | 372/99 |
| 4,562,582 | 12/1985 | Tokura | 455/617 |
| 4,608,682 | 8/1986 | Nagashima | 370/4 |
| 4,719,636 | 1/1988 | Yamaguchi | 372/96 |

FOREIGN PATENT DOCUMENTS

0143561 6/1985 European Pat. Off. .
2248211 4/1974 Fed. Rep. of Germany .
55-55638 4/1980 Japan .

OTHER PUBLICATIONS

Venkatesan, Miniaturised Hybrid 500MB/s Optic Rcvr Package for Data-Link Applications, Electronic Letters, 3-79, vol. 15, No. 6, p. 171.
Smith, Laser Level Control Circuit for High Bit Rate System Using a Slope Detector, pp. 775-776, Electronic Letters, No. 78, vol. 14, No. 24.
IEEE Spectrum, vol. 21, No. 5m, May 1984, IEEE (New York, US), S. Kobayashi et al., "Semiconductor Optical Amplifiers", pp. 26-33.
1973 IEEE/OSA Conference on Laser Engineering and Applications, 30 May-1 Jun. 1973, Washington, IEEE (New York, US), D. Schicketanz et al., "Optical Repeater for a Wideband Fiber Comminication System", p. 24.
Electronics Letters, vol. 21, No. 11, 23 May 1985 (Stevenage, Herts, GB), M. D'Mahony et al: "Low-Reflectivity Semiconductor Laser Amplifier with 20db Fibre-to-Fibre Gain at 1500 mm", pp. 501-502.
"Generation of Tunable Subnanosecond Laser Pulses With a Nitrogen Laser Pumped Dye Laser Amplifier System", *Optics Communications*, vol. 30, No. 3, North-Holland Publishing Company, Amsterdam, Sep. 1979, pp. 437-439.
Kawaguchi et al., "Bistable Operation In Semiconductor Lasers With Inhomogenous Excitation", 17 *Electronics Letters*, No. 4 (19 Feb. 1981).

Primary Examiner—Robert L. Griffin
Assistant Examiner—L. Van Beek
Attorney, Agent, or Firm—Nixon & Vanderhye

[57] ABSTRACT

An optical signal regenerator includes an optical coupler having a first input for an optical information signal, a second input for optical clock pulses and an output for a combined signal. A resonant laser amplifier is located downstream of the output of the coupler and arranged to receive the combined signal and, in use, output a regenerated optical information signal. The bias current applied to the laser amplifier, in use, biases the amplifier to a level below its lasing threshold, and the power of the optical clock pulses is just below the bistable threshold of the amplifier, so that, when an optical information signal is fed into the first input during the application of an optical clock pulse to the second input, the bistable threshold of the amplifier is exceeded causing a sudden jump in the power of the optical output of the amplifier to provide a regenerated optical information signal.

8 Claims, 5 Drawing Sheets

BISTABLE OPTICALLY CLOCKED OPTICAL SIGNAL REGENERATOR

BACKGROUND OF THE INVENTION

Communications and data transmission systems which transmit information signals in the form of optical pulses over a dielectric waveguide such as an optical fibre are now commonplace. Whilst improvements in the sources of the optical pulses and in the optical fibre waveguides have increased the range over which such signals can be transmitted to between 100 and 200 kilometers it is still necessary to regenerate the signals when they are transmitted over greater distances and when their power is reduced by beam splitting or being switched or otherwise handled. In a conventional regenerator, the optical signal is received by a photodiode and converted to an electrical signal. This electrical signal is then amplified and reshaped in an electronic regenerator circuit before being converted by an optical source into an optical pulse once again for onward transmission along the next optical fibre transmission line.

SUMMARY OF THE INVENTION

In this specification, the term optical is intended to refer to the visible region of the electromagnetic spectrum together with those parts of the infrared and ultraviolet regions at each end of the visible region which are capable of being transmitted by dielectric optical waveguides such as optical fibres.

According to this invention an optical signal regenerator comprises an optical coupler having a first input for an optical information signal, a second input for optical clock pulses and an output for a combined signal, and a resonant laser amplifier downstream of the output of the coupler and arranged to receive the combined signal and, in use, output a regenerated optical information signal. The bias current applied to the laser amplifier, in use, biases the amplifier to a level below its lasing threshold, and the power of the optical clock pulses is just below the bistable threshold of the amplifier, so that, when an optical information signal is fed into the first input during the application of an optical clock pulse to the second input, the bistable threshold of the amplifier is exceeded causing a sudden jump in the power of the optical output of the amplifier to provide a regenerated optical information signal.

It should be noted that the lasing threshold and the bistable threshold apply to distinct phenomena. In the optical regenerator, the electrical bias applied to the laser amplifier is below the lasing threshold bias current and consequently the amplifier does not lase. The sudden amplification occurs because the optical power of an input optical signal is made to exceed an optical power bistable threshold for the amplifier.

When the optical power input to a semiconductor laser amplifier is increased, the extra stimulated emission raises the recombination rate. The carrier density is correspondingly reduced. As a result, the effective refractive index of the active region of a resonant laser amplified increases with the optical power passing through it. The amplifier resonances are thereby tuned to longer wavelengths, and the gain at a given wavelength therefore varies. The power transfer characteristics of such an amplifier are consequently non-linear and, at appropriate input wavelengths, bistable operation is made possible.

Regeneration is achieved by combining an input signal with an optical clock signal and coupling them both into the resonant optical amplifier.

The clock signal consists of a train of optical pulses at the desired regeneration rate and with a wavelength at which the amplifier is bistable. The peak power of the clock signal is held marginally below the bistable threshold optical power level at which the amplifier will jump into a higher gain state.

With a low level input signal the output of the amplifier is in a lower gain state and its output comprises the slightly amplified clock signal. When the input signal increases to a high enough level such that the extra power in the combined input and clock signals is sufficient to exceed the bistable threshold then suddenly the resonant wavelength of the laser amplifier is matched to that of the light passing through it and the amplifier jumps into the higher gain state. It remains in this state, even if the input signal level again falls, until the end of the current clock pulse. The output of the amplifier for that period then includes a highly amplified clock pulse.

The complete regenerated signal comprises a train of return-to-zero pulses with the timing and wavelength of the clock signal.

The input signal need not be at the same wavelength as the cock signal, so long as the amplifier has adequate gain at the input signal wavelength to trigger the bistable operation. Therefore, for example, the wavelength may be shifted between input and output by multiples of the amplifier mode spacing.

The optical signal regenerator may include an optical clock pulse generator which generates optical clock pulses in synchronism with a standard clock such as a system clock or, alternatively, it may be arranged to recover timing information from the input optical information signal and generate the clock pulses in accordance with this recovered timing information.

The optical signal regenerator may also include biasing means such as a constant current source to provide a bias current which biases the laser amplifier to a level just below its lasing threshold. When the regenerator includes an optical clock pulse generator preferably it also includes power control means which control the power of the optical clock pulses to a level just below the bistable threshold of the laser amplifier. For example, the control means may monitor the output of the laser amplifier at a time that the regenerated output signal is not being emitted and control the power of the clock pulses in accordance with the monitored output.

The resonant laser amplifier is preferably formed by a semiconductor laser amplifier and this may have the form of a resonant Fabry-Perot amplifier or a distributed feedback laser.

Preferably the clock pulses do not have the same wavelength as the input optical information signal and preferably the clock pulses have a wavelength slightly longer than that of the input information signal. However, the clock pulses may be removed from the input information signal by multiples of the mode spacing in either direction when the laser amplifier is of the Fabry-Perot type. Typically the clock pulses would be of the order of ten or tens of nanometers longer or shorter than that of the input information signal. In this way the regenerated optical information output signal which has the same wavelength as the clock pulses has its wavelength shifted from that of the input information signal and this can be an advantage in some applications. Indeed the regenerator can be used as a wavelength shifter.

Filtering means such as a monochromator or narrow bandpass filter may be located downstream of the resonant laser amplifier to separate the regenerated information signal from the slightly amplified input information signal and any spontaneous emission generated by the laser. However, filtering means are unnecessary when equipment which receives the regenerated information signal downstream from the laser is only responsive to light of the regenerated signal wavelength.

BRIEF DESCRIPTION OF THE DRAWINGS

A particular example of a signal regenerator in accordance with this invention together with an experiment to demonstrate its operation will now be described with reference to the accompanying drawings in which.

DESCRIPTION OF THE PREFERRED EMBODIMENT(S)

Figure 3:
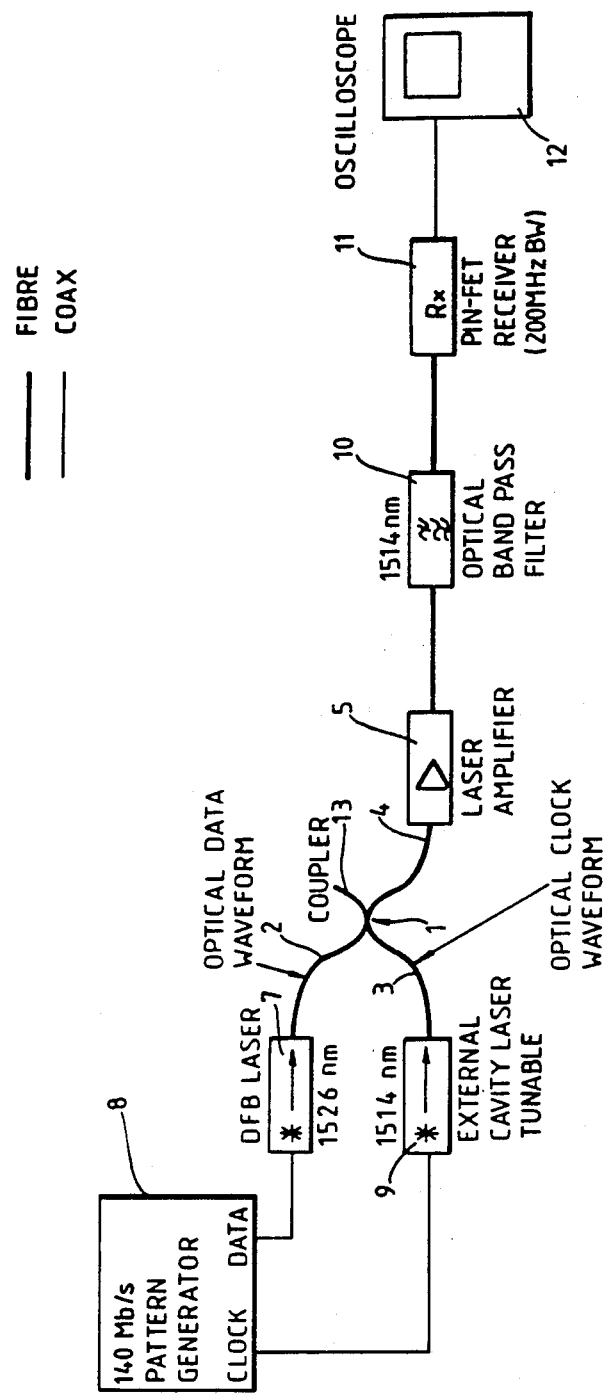
FIG. 3 is a diagram of a regenerator together with equipment to demonstrate its operation; and, FIGS. 4, 5, 6 and 7 are oscillographs showing the output of the regenerator with data low, and with data high, an input data stream, and a corresponding regenerated output data stream, respectively.

Referring first to FIG. 3, the illustrated optical signal regenerator in accordance with this invention includes an optical coupler 1 having an optical signal input 2, a clock pulse input 3 and an output 4 for the combined signal, and a laser amplifier 5 coupled to receive the combined signal from the output 4. The laser amplifier 5 is a double channel planar buried heterostructure semiconductor laser such as that described in an article in Electronics Letters 23 May 1985, Vol. 21, No. 11, pages 493-494, entitled "High Performance DC-PBH Lasers at 1.52 micrometers by a Hybrid MOVPE/LPE Process", by Nelson A. W., Wong S., Regnault J. C., Hobbs R. E., Murrel D. L., and Walling R. H. The facet reflectivies of the laser are reduced to 3% by the application of anti-reflection coating.

In an experiment to demonstrate the effectiveness of the regenerator an input signal to the first input 2 is produced by a distributed feedback laser 7 having a wavelength of 1526 nm which is driven from a 140 Mb/second pattern generator 8. This provides a continuous stream of optical pulses representing a stream of optical information. The pattern generator 8 is also used to drive a clock source formed by an external cavity tuneable laser 9 having a wavelength of 1514 nm. The output of the laser amplifier 5 passes through an optical bandpass filter 10 centred on 1514 nm and the output from this is received by a photodiode 11 connected to an input of a oscilloscope 12. The combined optical signal input to the amplifier can be monitored at the output 13 of the coupler 1 using a receiver and oscilloscope arrangement analogous to that illustrated for monitoring the amplifier output. Alternatively the output 13 may be conventionally terminated in a non-reflecting manner.

Figure 1:
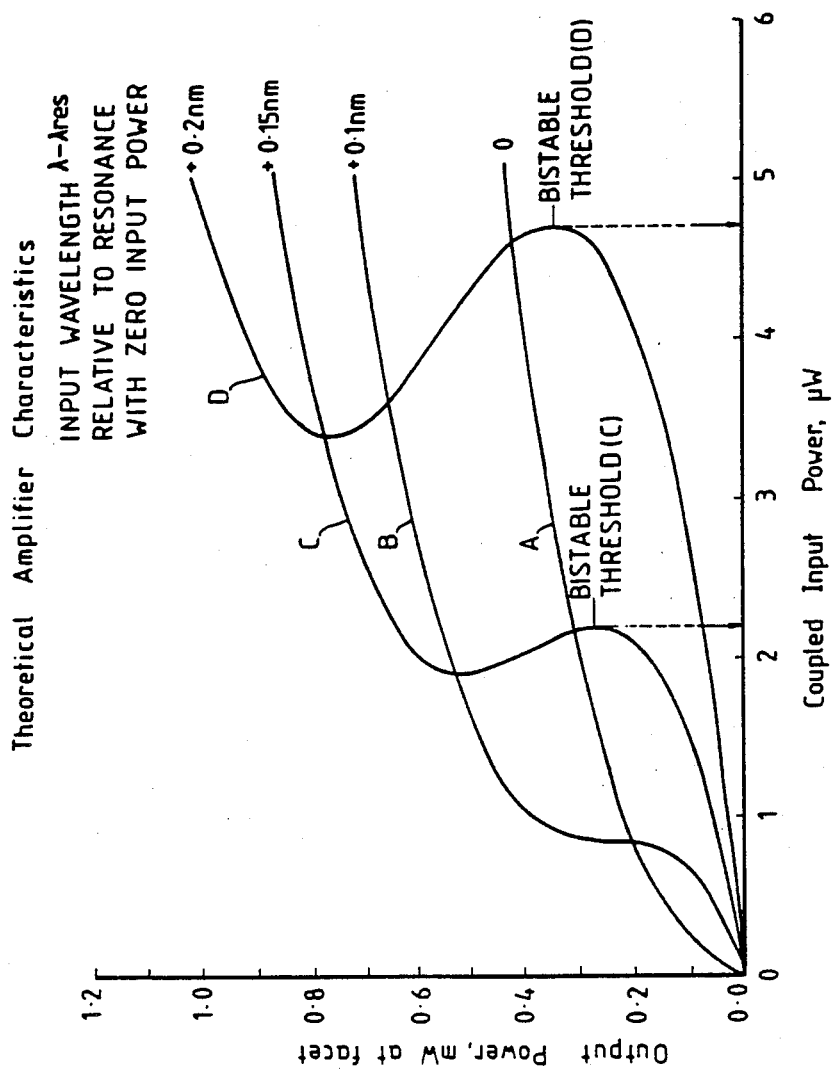
FIG. 1 is a graph illustrating the output power-input power characteristics of an amplifier for light of different wavelengths.

FIG. 1 shows typical theoretical characteristics of the amplifier 5 for light input of four different wavelengths A, B, C, D at 0, 0.1, 0.15 and 0.2 nm longer respectively than a resonant wavelength for the amplifier at zero input power. For light having a wavelength which is different from the resonant wavlength of the amplifier at zero input power the characteristic curve is generally S-shaped. In this case, where the input wavelength exceeds the zero power resonance by 0.1 nm or less, as shown by curves A and B, the characteristic is not bistable. The S-shaped curves C and D illustrate the bistable nature of the laser amplifier when the input wavelength is slightly longer. Under these conditions, as the input power increases the output power gradually increases until it approaches the first knee of the curve which defines the bistable threshold of the laser amplifier for the jump to the higher amplification level for that input wavelength. As soon as the input power reaches this bistable threshold there is a sudden jump as the output power increases to that shown by the upper part of the curve.

Figure 2:
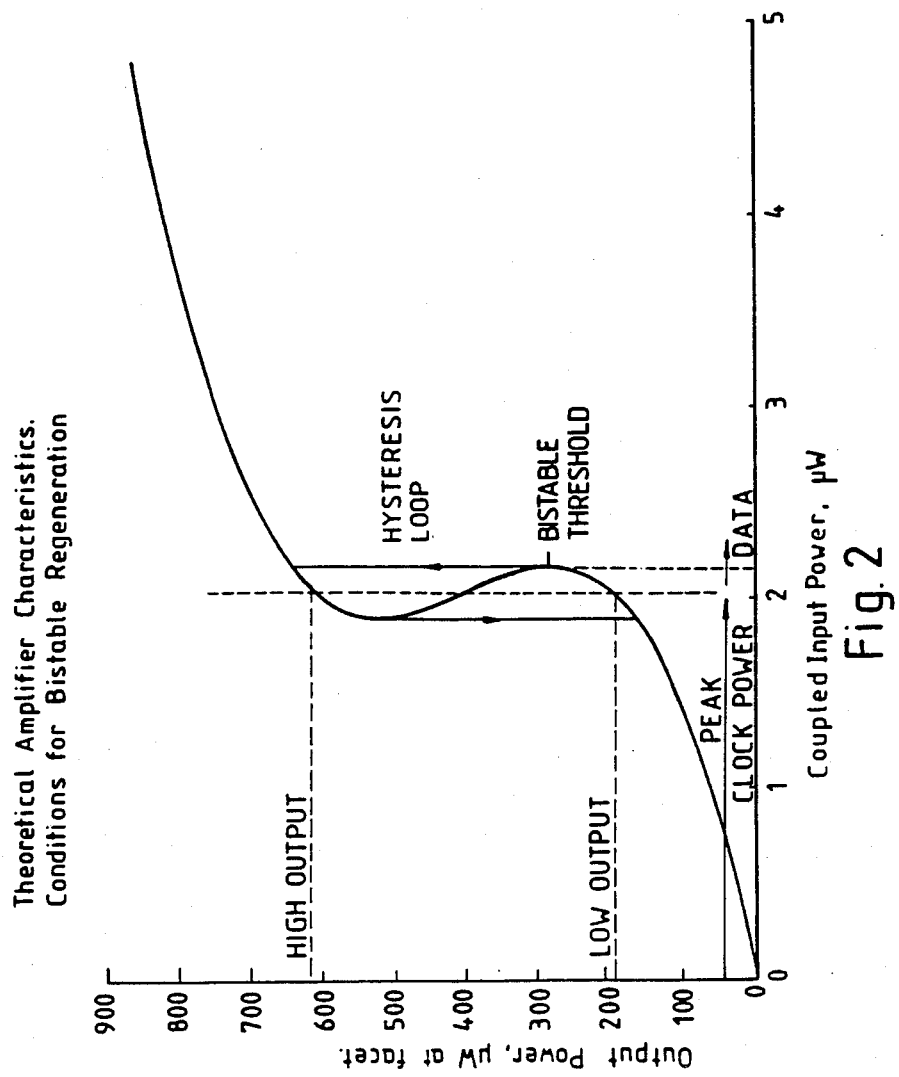
FIG. 2 is a graph of output power against input power illustrating the typical operation range for the laser amplifier.

FIG. 2 shows one such curve. From this Figure, it is clear that if the power of the clock signals passing through the laser 5 is arranged to be close to the bistable threshold then a slight increase in the optical power, for example that provided by the optical information in an input optical signal, is just sufficient to exceed the bistable threshold. This results in an immediate jump in output power of the amplifier to the upper part of the curve shown in FIG. 2. During any subsequent reduction of the optical input information signal the output power returns along the upper part of the curve. The regenerated output signal therefore remains high for the remainder of the duration of the clock pulse irrespective of a subsequent fall in the optical information signal. Thus, with both the clock signal and a information signal being applied to the laser amplifier 5, for example, the output of the amplifier follows the hysteresis loop shown in FIG. 2 moving between the high and low amplification levels to provide a regenerated signal which consists of large and small pulses at the clock frequency corresponding to "ones" and "zeroes" in the input signal. The low level amplification of the clock signal during the input signal lows therefore means that the extinction ratio is finite.

Figure 4:
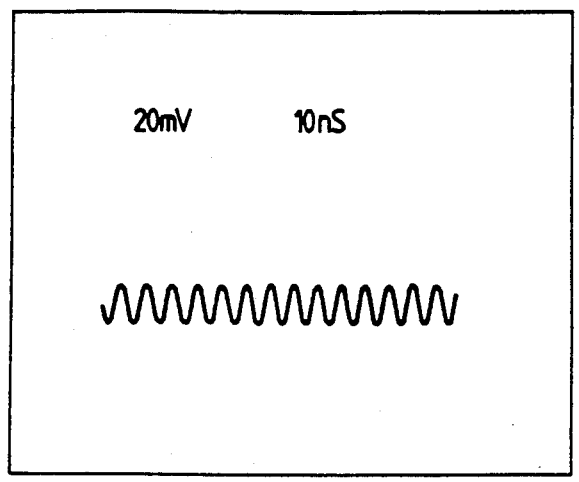
Figure 5:
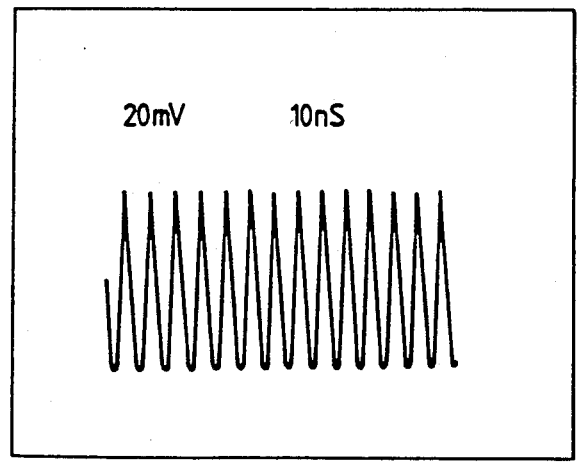
Figure 6:
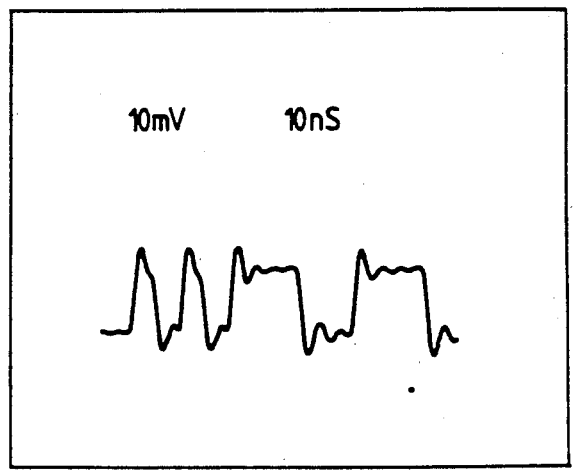
Figure 7:
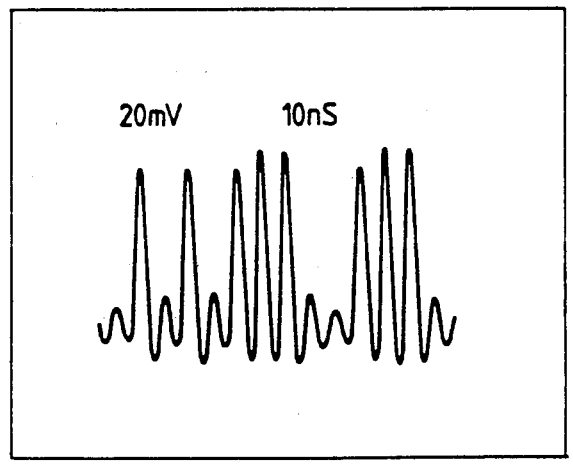

A shown in FIG. 4, initially with the laser 9 providing a string of clock pulses but with the laser 7 not providing any optical information signals the clock pulses are slightly amplified in passage through the laser amplifier 5 with a resultant low level output at 1514 nm. In the present example, with the laser 7 producing a signal with a continuous high level of around 1 microwatt at the input to the amplifier the bistable threshold was reached and the output clock pulses abruptly jumped to a high level at 1514 nm as shown in FIG. 5. FIG. 6 illustrates a typical optical data stream input to the amplifier when the distributed feedback laser 7 is modulated by the pattern generator 8 with a non-return-to-zero data stream at 140 mb/second. The corresponding output of the laser amplifier 5 is a regenerated pattern in a return-to-zero format 1514 nm as shown in FIG. 7.

I claim:

1. An optical signal regenerator comprising:
   an optical coupler having a first input for an optical information signal, a second input for optical clock pulses and an output for a combined signal, an optical clock signal generator which generates the optical clock pulses and applies them to the second input and including power control means which controls the power of the optical clock pulses to a level just below the bistable threshold of the laser amplifier;

a resonant laser amplifier located downstream of the output of the coupler and arranged to receive the combined signal and, in use, output a regenerated optical information signal; and means for applying a bias current to the laser amplifier, in use, biasing the amplifier to a level below its lasing threshold with the power of the optical clock pulses being just below the bistable threshold of the amplifier, so that, when an optical information signal is fed into the first input during the application of an optical clock pulse to the second input the bistable threshold of the amplifier is exceeded causing a sudden jump in the power of the optical output of the amplifier to provide a regenerated optical information signal.

2. An optical signal regenerator according to claim 1, in which the resonant laser amplifier is formed by a semiconductor laser amplifier.

3. An optical signal regenerator according to claim 2, in which the semiconductor laser amplifier is a resonant Fabry-Perot amplifier.

4. An optical signal regenerator according to claim 2, in which the semiconductor laser amplifier is a distributed feedback laser.

5. An optical signal regenerator according to claim 1, which also includes filter means located downstream of the resonant laser amplifier to separate the regenerated information signal from the slightly amplified input information signal and any spontaneous emission generated by the laser.

6. An information transmission system including an optical signal regenerator according to claim 1, 2 or 5 disposed between an input optical transmission fiber and an output optical transmission fiber.

7. An optical signal regeneator comprising:

a resonant laser amplifier biased below its lasing threshold and coupled to receive into its lasing volume both (a) optical information pulses and (b) optical clock pulses; and means for causing said laser amplifier to operate in a bistable signal regeneration mode describing a hypteresis loop on a plot of output versus input optical power which has both low and high output power states with bistable switching to a first output state occurring upon the initial concurrent presence of both an information pulse and a clock pulse and with subsequent bistable switching to the second output state occurring when such clock pulse is terminated.

8. A method for achieving optical signal regeneration comprising:

biasing a resonant laser amplifier below its lasing threshold and coupling into its lasing volume both (a) optical information pulses and (b) optical clock pulses; and causing said laser amplifier to operate in a bistable signal regeneration mode describing a hypteresis loop on a plot of output versus input optical power which has both low and high output power states with bistable switching to a first output state occurring upon the initial concurrent presence of both an information pulse and a clock pulse and with subsequent bistable switching to the second output state occurring when such clock pulse is terminated.

* * * * *